United States Patent [19]
Vaillancourt et al.

[11] Patent Number: 5,416,420
[45] Date of Patent: May 16, 1995

[54] METHOD AND APPARATUS FOR THE VERIFICATION OF AN ELECTRICAL INSULATOR DEVICE BASED ON THE ANALYSIS OF THE ELECTRIC FIELD ALONG THE INSULATOR

[75] Inventors: Georges H. Vaillancourt, Beloeil; Charles Jean, Montreal, both of Canada

[73] Assignee: Hydro-Quebec, Montreal, Canada

[21] Appl. No.: 165,347

[22] Filed: Dec. 13, 1993

[51] Int. Cl.⁶ .................... G01R 31/12; G01R 29/12
[52] U.S. Cl. ................................. 324/552; 324/530; 324/559
[58] Field of Search ............. 324/527, 528, 530, 531, 324/541, 544, 551, 557, 559, 72, 126, 552

[56] References Cited
U.S. PATENT DOCUMENTS 4,758,792 7/1988 Polonis et al. ............... 324/559 X
4,760,343 7/1988 Vaillancourt et al. .

*Primary Examiner*—Kenneth A. Wieder
*Assistant Examiner*—Diep Do
*Attorney, Agent, or Firm*—Oblon, Spivak, McClelland, Maier & Neustadt

[57] ABSTRACT

A method and apparatus for verifying the condition of an electrical insulator which is placed between two live conducting elements which are separated by the insulator. The insulator has a continuous electrically insulating core that may be covered with other types of insulating material. The insulator may also be a lightening arrester consisting of stacked insulating discs. An electric field detecting apparatus is positioned at a plurality of locations along the insulator to measure the intensity of an electric field created along the insulator. At each location a detected signal value of the electric field is stored within the apparatus and all of these signals are analyzed to detect deviations from expected values of the electric field and indicative of a fault(s) along the insulator.

15 Claims, 2 Drawing Sheets

LENGTH OF THE INSULATOR
VALUE OF THE MEASURED ELECTRIC FIELD
AS A FUNCTION OF THE POSITION OF THE DETECTOR

METHOD AND APPARATUS FOR THE VERIFICATION OF AN ELECTRICAL INSULATOR DEVICE BASED ON THE ANALYSIS OF THE ELECTRIC FIELD ALONG THE INSULATOR

TECHNICAL FIELD

The present invention relates to a method and an apparatus for the verification of the condition of an electrical insulator placed between two live conducting elements and wherein the detection of faults is determined by the analysis of the electric field created along an insulating core of the insulator.

BACKGROUND ART

In electric circuits, the conductors are generally electrically insulated and spaced from one another by a plurality of electrical insulators. When the conductors are at different alternating or continuous potentials, there is created about the insulators, an electric field in which the distribution thereof in space varies in accordance with the geometry of the interconnection, the differential in potential, and the composition of materials utilized. If there is a fault inside the insulator or at its surface, then the distribution of the electric field will be affected or perturbed in the area of the fault.

Devices have been developed to verify the condition of porcelain type insulators of the type having a plurality of porcelain bushings interconnected to one another in series to form a chain. Each element in the chain is verified independently and individual defective ones can be identified. However, with respect to continuous insulators which have a single continuous insulating core, such as a body or rod-like element of porcelain or fiberglass that may be covered with insulating material, no adequate means has heretofore been developed to verify its integrity. This is particularly so with composite insulators which are formed of a single rod-like insulating core as the risks are higher when there is a defect as compared to the porcelain chain type insulating devices as aforementioned where one or several elements in the chain can fail without presenting serious inconvenience to the insulator or maintenance personnel if these are detected early. The lack of means to verify the condition of composite insulators has caused hesitation on the part of contractors to use such devices. In fact, the lack of proper testing apparatus has resulted in the lack of data concerning the life expectancy of composite insulators. There is also a need to verify the uniformity of these composite insulators at the manufacturing stage so that fabricators can provide adequate data on these composite insulators.

Because the composite insulator has a single continuous insulating core, such as a ceramic or fiberglass rod, a defect in the ceramic or fiberglass rod may not be detected and cause serious injury to an installer. In order to reduce this risk, there is a need to provide a portable test apparatus capable of performing a verification of the insulator prior to its installation and after it has been in service. A partially defective composite insulator could fail completely at the time when an operator is effecting maintenance work or installing the insulator between live wires. Although there is a small risk of such injury, this risk can be eliminated if proper test apparatus were provided. Currently composite insulators are verified only by sight and sound to reveal defects and this is very hazardous to the installers, the maintenance personnel, and to the H.V. distribution or transmission network incorporating such composite insulators.

SUMMARY OF INVENTION

There is therefore a need to provide a method and apparatus capable of verifying the condition of an electrical insulator having a continuous electrical insulating core, and particularly but not exclusively a composite insulator connected between two live conducting elements whereby to assure the efficiency of the insulator while in use. Such need is met by the present invention.

Another feature of the present invention is to provide a method and an apparatus to verify the condition of an electrical insulator of the type having a continuous electrical insulating core, and preferably but not exclusively a composite insulator, prior to the installation of same between conducting elements whereby to ensure that the insulator has not been damaged since its fabrication while in storage or during transportation.

Another feature of the present invention is to provide a method and an apparatus for verifying the condition of an electrical insulator having a continuous electrical insulating core, and preferably but not exclusively a composite electrical insulator, in the manufacturing plant to assure that the insulating core of the device has uniformity and is therefore free of faults that may have been caused in the fabrication and that could cause failure of the insulator when placed in use.

Another feature of the present invention is to provide a method and an apparatus for verifying the condition of an electrical insulator having a continuous electrical insulating core, and preferably but not exclusively a composite electrical insulator, whereby the fabricator can provide a guarantee to the installer or contractor that the insulator will not be defective at the time of installation on electrical conductive lines or cables or other such conductive elements and wherein the testing of the insulator can be effected after installation.

Another feature of the present invention is to provide a method and an apparatus for verifying the condition of an electrical insulator having a continuous electrical insulating core, and preferably but not exclusively a composite insulator, which is connected between two live conducting elements and wherein the apparatus provides safety to the user/installer.

Another feature of the present invention is to provide a method and an apparatus for verifying the condition of an electrical insulator having an electrical insulating core, such as a composite electrical insulator, lightening arresters, insulating support for high voltage conductors or equipment, etc., and connected between live conducting elements.

Another feature of the present invention is to provide a method and apparatus for automatically verifying the condition of an electrical insulator having a continuous electrical insulating core and connected between two live conducting elements in a high voltage transmission or distribution network.

According to the above features, from a broad aspect, the present invention provides a method of verifying the condition of an insulating core of an electrical insulator connected between two live conducting elements which are separated by the insulator. The insulator has a continuous electrical insulating core. The method comprises the step of positioning an electrical field detection device at a plurality of locations along the insulating core to obtain and measure a voltage value proportional to an electric field created along the insulating core when a high voltage is applied thereto. A voltage value of the intensity of the electric field at the plurality of locations is obtained and stored. These voltage values are analyzed to detect any sudden decrease voltage values indicative of faults in the areas of said decrease along the insulating core or in the covering insulating material, at the surface, or at the interface.

According to a still further broad aspect of the present invention, there is provided an apparatus for the verification of an electrical insulator which is connected between two high voltage conducting elements which are separated by the insulator. The insulator has a continuous electrically insulating core but may be covered with other insulating materials. The apparatus comprises an electric field detecting device having positioning means to position the device at a plurality of locations along the insulating core to obtain and measure a voltage value proportional to an electric field created along the insulating core by the presence of the high voltage. The detecting means has storage means to store a detected voltage value obtained at each of the locations. Processing means is also provided to analyze the voltage values to detect a sudden decrease in the electric field and which are indicative of faults at the area of decrease in the insulating core or in the covering insulating material, if present.

Preferably, but not exclusively, the method and apparatus is utilized to detect faults in composite electrical insulators and this being done either by the fabricator when the insulators are manufactured or can be verified before being installed or after installation by the installer or at anytime thereafter by maintenance personnel. The electrical insulator may also consist of various types of electrical insulating devices, such as lightening arresters, insulating supports for high voltage conductors or equipment, etc.

BRIEF DESCRIPTION OF DRAWINGS

A preferred embodiment of the present invention will now be described with reference to the accompanying drawings in which.

DESCRIPTION OF PREFERRED EMBODIMENTS

Figure 1:
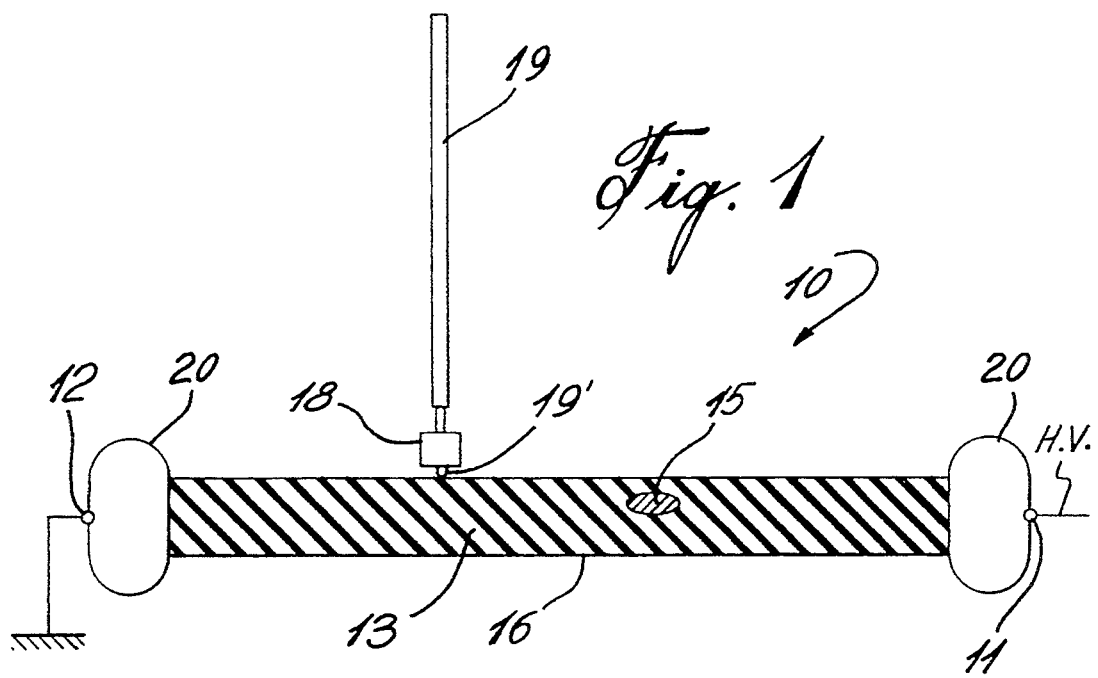
FIG. 1 is a schematic illustration of the method and apparatus for the verification of the condition of a continuous electrically insulating core of an insulator.

Referring to the drawings, and particularly to FIG. 1, there is shown generally at 10 an electrical insulator which is connected between two live conducting elements, herein two high voltage wires 11 and 12 of a power distribution or transmission network. A differential in the potential between the high voltage wires 11 and 12 exist with wire 11 being at higher potential. The insulator 10 maintains these electrical elements spaced apart in an insulating manner.

Figure 2:
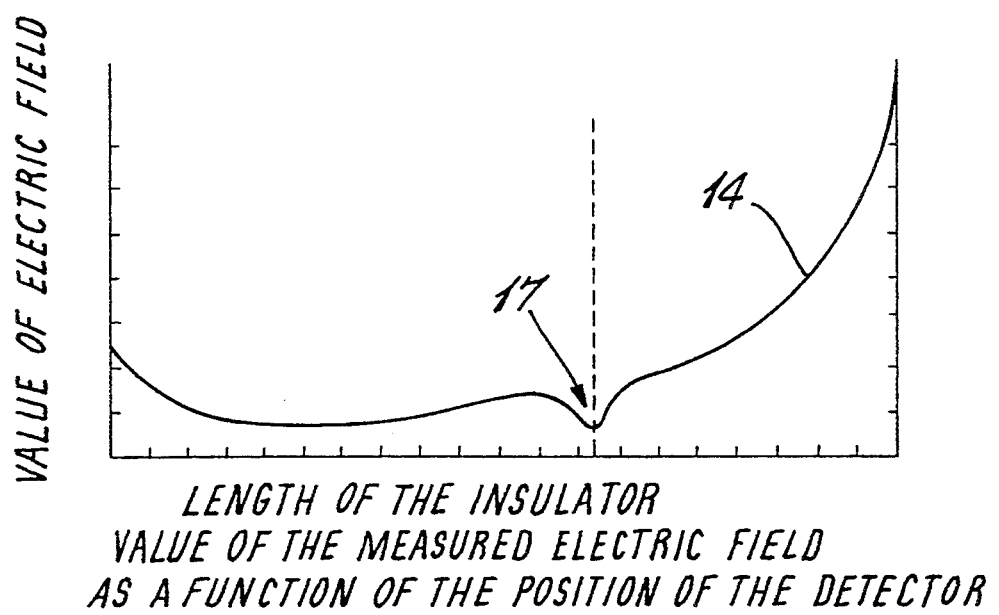
FIG. 2 is a characteristic curve illustrating an electric field having a deviation representative of a fault inside the insulating core or at its surface, as illustrated in FIG. 1.

The insulator 10 is formed of an insulating material, such as ceramic and in this particular embodiment, the insulator is a composite insulator which has a continuous electrically insulating core 13. The present invention is concerned with a method and apparatus for verifying the condition of the insulating core 13 while it is connected in a live circuit with a potential difference applied thereacross whereby an electric field is created. The typical pattern of this electric field is illustrated at 14 in FIG. 2. The terminal connections which are herein schematically illustrated at 20 are fixed to the insulator 10. The insulating core 13 can also be formed of materials other than porcelain, such as fiberglass, polymer or any other suitable insulating material. In a composite insulator, or lighting arrester, the material can also be comprised of different electrical insulating materials, such as a composition of epoxy resin, fiberglass and/or other suitable electrically insulating material compositions.

More specifically, the present invention is concerned with a method and an apparatus for verifying the condition of the electrically insulating core 13 to determine if there are any faults therein, such as the conducting spot 15, as shown in FIG. 1 or cracks in the outer surface contamination 16 thereof. The method concerns the detection and evaluation of a plurality of signal values taken along the insulating core and these are representative of the electric field which is created about the insulating core 13 when a differential in potential is applied to the opposed ends of the insulator 10 when the insulator is connected to an electrical source. These signal values are analyzed to detect deviations from expected values of the electric field. Such a deviation is illustrated at 17 in FIG. 2 and it shows an inconsistency in the electric field pattern 14 at the location of the defect herein cavity 15 located within or on the insulating core 13. Such defects may not be clearly visible to the human eye and may not be detected by the fabricator or user but could cause a fault in the insulator at the time of installation and resulting in a possible fatality and damage to the electrical distribution or transmission network.

Figure 3:
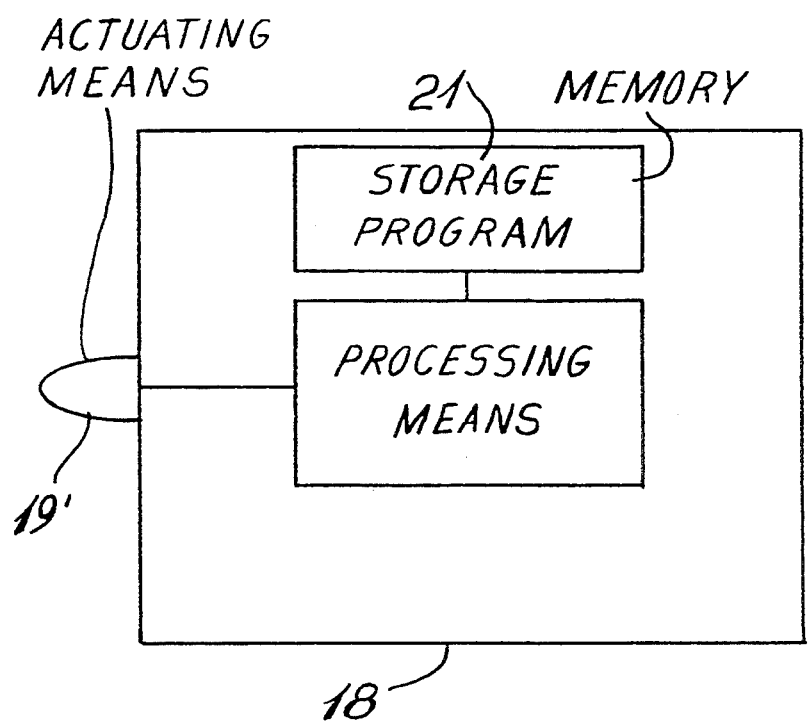
FIG. 3 is a block diagram illustrating the circuits of the probe.

In order to test the insulator 10, and with further reference to FIG. 3, there is provided, in accordance with the present invention, an apparatus which is herein comprised of an electric field detecting device 18, secured to the end of insulating pole 19 for placing the detecting device 18 at a plurality of locations along the continuous insulating core 13 from one end to the other. The electrical field detecting device 18 is also provided with a pressure sensitive switch 19' which when a contact thereof is applied against the outer surface 16 of the insulator body, will close the switch and cause the detector to record a value in an internal memory storage device 21. This detected signal value is a voltage which is proportional to the electric field value at a particular location, as well known in the art, and representative of the electric field at that particular location. Alternatively, the pressure sensitive switch 19' may be actuated by means other than pressure contact. Conceivably, the detecting device would be actuated by an infrared detecting light beam or other proximity swiching means. The pole is supported by an operator who displaces the detector to a next location where another reading is taken and this continues all along the insulator body. It is also conceivable that the detecting device may be mounted on a track, a sled, or other means, whereby to scan the insulator and provide electrical signals representative of the electric field. The detecting device is also provided with a processor having a program capable of analyzing the signal values to detect deviations, such as deviation 17, from the expected value of the electric field 14 whereby to detect faults.

An advantage of the present invention is that the insulator 10 can be tested by the fabricator after the insulator is made. This, for example, can be done by connecting the insulator 10 to test electrodes, herein represented by the terminal connectors 20 and wherein a voltage differential would be applied thereacross. The detector 18 could be supported on a track fixed at a predetermined distance from the insulating core 13 and displaced therealong to take readings whereby to automatically verify the integrity of the material forming the insulating core 13 and thereby detect faults, if any.

It is within the ambit of the present invention to cover any obvious modifications of the preferred embodiment described therein, provided such modifications fall within the scope of the appended claims.

We claim:

1. A method of verifying the condition of an insulating core of an electrical insulator connected between two live conducting elements which are separated by said insulator, said insulator having an electrically insulating core, said method comprising the steps of:
    i) positioning an electrical field detection device at a plurality of locations along said insulating core to obtain and measure a voltage value proportional to an electric field created along said insulating core when a high voltage is applied thereto;
    ii) obtaining and storing said voltage value proportional to said electric field detected at said plurality of locations, and
    iii) analyzing said voltage values proportional to said electric field to detect any sudden decrease voltage values indicative of faults in the area of said decrease along said insulating core.

2. A method as claimed in claim 1 wherein said step (i) comprises positioning a probe connected to said electrical field detection device for actuating switch element when said probe is positioned at a plurality of locations along said insulating core to take a reading of the voltage value proportional to said electric field at said locations, said probe being displaced from one end to another end of said insulating core at substantially regular intervals, said probe being secured at an end of an insulating support rod which is manipulated by a person or by other means.

3. A method as claimed in claim 1, wherein prior to step (i) said insulator device is connected between a pair of electrodes which are connected across a high voltage source to thereby create an electric field across said insulator device.

4. A method as claimed in claim 2, wherein said live conducting elements are electrical wires in a power distribution or transmission network, said wires being spaced apart by a plurality of said composite insulator rod, said steps (i) and (ii) being effected on site.

5. An apparatus for the verification of an electrical insulator which is connected between two high voltage conducting elements which are separated by said insulator, said insulator having an electrically insulating core, said apparatus comprising an electrical field detecting device having positioning means to position said detecting device at a plurality of locations along said insulating core to obtain and measure a voltage value proportional to an electric field created along said insulating core by the presence of said high voltage, said detecting device having storage means to store a detected voltage value obtained at each said locations, and processing means to analyze said voltage values to detect a sudden decrease in said electric field indicative of faults in said electrical insulator in the area of said decrease.

6. An apparatus as claimed in claim 5, wherein there is further provided actuating means to actuate said detecting device when placed in close proximity to said insulating core at each of said plurality of locations, said locations being at substantially regular intervals.

7. An apparatus as claimed in claim 5 wherein said means to position said detecting device is an elongated insulating pole adapted to be held by a person or other means, said live conducting elements being high tension wires.

8. An apparatus as claimed in claim 5 wherein said live conducting elements are a pair of electrodes which are connected across a high voltage source to thereby create an electric field across said insulator device to test the condition of said insulator device prior to the intended use of same.

9. An apparatus as claimed in claim 5 wherein said actuating means actuates a switch upon actuation thereof, said actuation means including infrared actuators and other suitable switches.

10. An apparatus as claimed in claim 5 wherein said processing means has a program to automatically detect faults in said insulating core by detecting sudden decreases in said detected voltage values proportional to said electric field created along said insulating core.

11. An apparatus as claimed in claim 5 wherein said electrical insulator is a composite insulator.

12. An apparatus as claimed in claim 5 wherein said insulating core is made from a composition of different electrical insulating materials, such as epoxy resins, fiberglass and/or other suitable electrical insulating materials.

13. An apparatus as claimed in claim 5 wherein said faults are located in said insulating core or on an outer surface thereof.

14. An apparatus as claimed in claim 5 wherein said insulator has a continuous electrically insulating core.

15. An apparatus as claimed in claim 5 wherein said insulator is a lightening arrester.

* * * * *